(12) United States Patent
Oravetz et al.

(10) Patent No.: US 6,294,721 B1
(45) Date of Patent: Sep. 25, 2001

(54) TEMPERATURE REGULATING ENCLOSURE FOR TELECOMMUNICATION BATTERIES

(76) Inventors: Thomas A. Oravetz, 2618 E. Shady Glen Ct.; Clyde J. Thompson, 2400 E. Lathoka; both of Springfield, MO (US) 65804

( * ) Notice: Subject to any disclaimer, the term of this patent is extended or adjusted under 35 U.S.C. 154(b) by 0 days.

(21) Appl. No.: 09/326,770

(22) Filed: Jun. 4, 1999

Related U.S. Application Data

(60) Provisional application No. 60/088,191, filed on Jun. 5, 1998.

(51) Int. Cl.[7] .................................... H01L 35/02
(52) U.S. Cl. ........................... 136/242; 136/203; 62/3.3
(58) Field of Search .................... 136/203, 201, 136/242; 429/62, 120, 96, 100; 62/3.3

(56) References Cited

U.S. PATENT DOCUMENTS

| | | |
|---|---|---|
| 4,229,687 | 10/1980 | Newman . |
| 4,314,008 | 2/1982 | Blake . |
| 5,689,957 | * 11/1997 | DeVilbiss et al. .................. 62/3.7 |

* cited by examiner

*Primary Examiner*—Kathryn Gorgos
*Assistant Examiner*—Thomas H. Parsons

(57) ABSTRACT

A new device is provided for controlling and maintaining the ambient air temperature within a remote telecommunications battery enclosure. A thermoelectric device located in intimate contact with heat exchangers and fans configured such that at least one heat exchanger is positioned within or spaced in thermal communication with the interior of the battery enclosure, and at least one heat exchanger is positioned outside of or spaced in thermal communication with a thermal dissipation arrangement exterior to the battery enclosure. The system further has a sensor or microprocessor connected to the thermoelectric device and configured to control the system to heat or cool the battery enclosure by responsively reversing polarity of the thermoelectric device as indicated by ambient air temperature or battery temperature to maintain the air temperature within predetermined limitations. A hydrogen vent is provided to maintain sub lower explosive levels of hydrogen gas within the battery enclosure.

5 Claims, 3 Drawing Sheets

TEMPERATURE REGULATING ENCLOSURE FOR TELECOMMUNICATION BATTERIES

This application claims benefit of Provisional Appln. 60/088,191 filed Jun. 5, 1998.

BACKCGROUND OF THE INVENTION

1. Field of the Invention

The present invention relates to a system that uses thermoelectrics to control the ambient air temperature of an enclosure designed to house, protect and extend the useful life of batteries used in the telecommunications industry. Particularly, the temperature regulated enclosure is used to house hydrogen producing batteries which supply back up or supplemental power for telephone services in the event of commercial AC electric power failure.

2. Description of the Related Art

Telecommunications equipment, such as switches and repeaters, necessarily is placed in central and remote geographic locations in a network. Most of this telecommunications equipment is powered by alternating current (AC) supplied by electrical power lines. However, a backup power source is used to provide electrical power if an outage occurs on the AC power lines so that the equipment will remain operational. Hydrogen producing batteries are commonly used to provide this backup power. In some instances, these types of batteries are used for the primary source of electrical power.

Typically, batteries used in these environments are housed in protective enclosures designed to shield the batteries from vandalism, weather conditions and more particularly extremes in ambient temperatures. Unfortunately, these enclosures generally exacerbate the temperature conditions to which the batteries are subjected. It is well known by those within the commercial battery industry, that the effective life span of a battery is significantly diminished by extreme ambient temperatures.

It is well established that temperature is critical to battery longevity and many commercial battery manufacturers will only provide a warranty on the life of commercial batteries stored and used at temperatures not exceeding 77° F.+/−5° F. Some manufacturers even prorate or void warranties for batteries kept at higher temperatures based on a decrease of 50% of battery life for every 15 to 17° F. above the recommended 77° F. temperature which the battery is subjected to on a cumulative basis. High temperatures greatly accelerate the production of hydrogen gas from the batteries. Therefore, it is very desirable to control the ambient temperature within the storage enclosure housing telecommunication batteries.

It would be ideal to have a battery enclosure which is well insulated and unventilated for the batteries to facilitate ambient air temperature control within the enclosure. However, most batteries used in the telecommunications industry, in applications such as that described produce hydrogen gas. The buildup of hydrogen gas within a battery enclosure is dangerous and incidents of explosions resulting from hydrogen gas have been documented. It is common to vent battery enclosures used to house hydrogen batteries in order to prevent accumulation of hydrogen gas. Unfortunately, by venting the battery enclosure, it becomes increasingly difficult to maintain consistent temperatures within the enclosure, thereby diminishing the longevity of the batteries. A heat exchanger and a hydrogen vent system are desirable to safely facilitate long battery storage and use.

Controlling temperature within a battery storage compartment is achieved with the inventive device which utilizes the principles of thermoelectrics which have been known since the early 1800's when the Peltier effect was discovered. The Peltier effect is the resultant temperature change which occurs when electric current is passed through a selected material forming a junction between two conductors. With the introduction of semi-conductor materials, practical applications of this principle have flourished. Today, doped bismuth telluride is commonly used to create the n-type and p-type junction necessary for the temperature change to occur.

A typical device consists of p-type and n-type couples arranged electrically in series and thermally in parallel between two metalized ceramic plates. Heat moves from one side to the other creating a hot side and a cold side. By reversing the polarity between the conductors, the device can selectively provide either a cooling effect or a heating effect. Fan equipped heat exchangers then are placed in intimate contact with each of the distinct sides to facilitate the exchange of heat into the surrounding environment, comprising a system commonly referred to as a "heat pump."

Known inventions utilize the Peltier effect to stabilize battery temperature rather than the ambient air temperature within a battery storage enclosure. One example of such a device may be found at U.S. Pat. No. 4,314,008 issued to Blake. The Blake device uses a Peltier type heat pump to manage battery temperature of rechargeable electrochemical cells by wrapping the battery in thermal insulation, such as a suitable thermally conductive "blanket", which directly contacts the heat pump.

While the Blake device is suited to small cell type batteries it is not adaptable for use with large batteries, such as those used in the telecommunications industry. Encapsulating telecommunications-type batteries with any thermal "blanket" exacerbates problems of hydrogen accumulation within the battery enclosure. During the recharging phase, batteries generate hydrogen gas which can accumulate to explosive levels which may be exacerbated by a thermal blanket. Further, a battery insulating blanket such as that described and claimed by Blake would be unduly burdensome, would be too costly to manufacture and use, and would necessitate much work to substitute, add, or remove serially connected batteries.

What is needed is an environmental control system for a telecommunications battery system that incorporates a thermoelectric device into a remote standby battery storage enclosure such that ambient air temperature in the enclosure is reliably maintainable within selected parameters calculated to provide maximum remote battery life for telecommunication systems. Further, a device is needed which diminishes the problem of hydrogen gas buildup within the battery storage enclosure while allowing efficient maintenance of ambient air temperature within the enclosure. It is desirable to provide a device as described which may readily be retrofitted onto existing battery enclosures with minimal effort at a reasonable cost.

SUMMARY OF THE INVENTION

A new device is provided for controlling and maintaining the ambient air temperature within a remote telecommunications battery enclosure. The device includes a preferably modular housing enclosure of sufficient size to accommodate a predetermined number of commercial telecommunication batteries arranged for receiving power from an external power source, and at least one electrically powered thermoelectric device located in intimate contact with heat exchangers and fans configured such that at least one heat exchanger is positioned within or spaced in thermal communication with the interior of the battery enclosure, and at least one heat exchanger is positioned outside of or spaced in thermal communication with a thermal dissipation arrangement exterior to the battery enclosure.

The system further has a sensor and a microprocessor operably connected to the thermoelectric device configured to control the system to heat or cool the battery enclosure by responsively reversing polarity of the thermoelectric device as indicated by ambient air temperature or battery temperature to maintain the air temperature within predetermined limitations. The device will provide ventilation openings for the exchange of air between the environment and the battery enclosure. The provided vents will be designed to minimize condensation and evacuate accumulated hydrogen gas when present from within the enclosure with the vents of sufficient size and configuration to maintain sub Lower Explosive Limits (LEL) of hydrogen gas within the enclosure.

By applying the apparatus as described in the present invention, several advantages are realized. The battery enclosure may be insulated and sealed to control temperatures more readily. As provided, the exchange of air with the outside environment through the thermoelectric temperature control assembly will be limited; consequently all air circulated within the battery enclosure will be either heated or cooled by the thermoelectric device while allowing only accumulated hydrogen gas mixture to be evacuated through the vents. The microprocessor operates as a programmable control over the system allowing relatively precise control of the absolute level of temperature within the battery enclosure and allows fluctuation of the internal enclosure temperature within predetermined temperatures on an as needed basis without the need for constant or even occasional monitoring by personnel, either in the field or remotely.

The thermoelectric device and the associated heat exchangers and fans and controls are self contained within the housing module and are operably connected to the battery housing enclosure by a port which allows air within the battery enclosure to pass over the heat exchanger located within the battery enclosure which allows easy retrofit onto existing telecommunication battery enclosures or application to any variety of size.

BRIEF DESCRIPTION OF THE DRAWINGS

The preferred embodiment of the present invention is further described in connection with the accompanying drawings, in which.

DETAILED DESCRIPTION OF THE INVENTION

Figure 1:
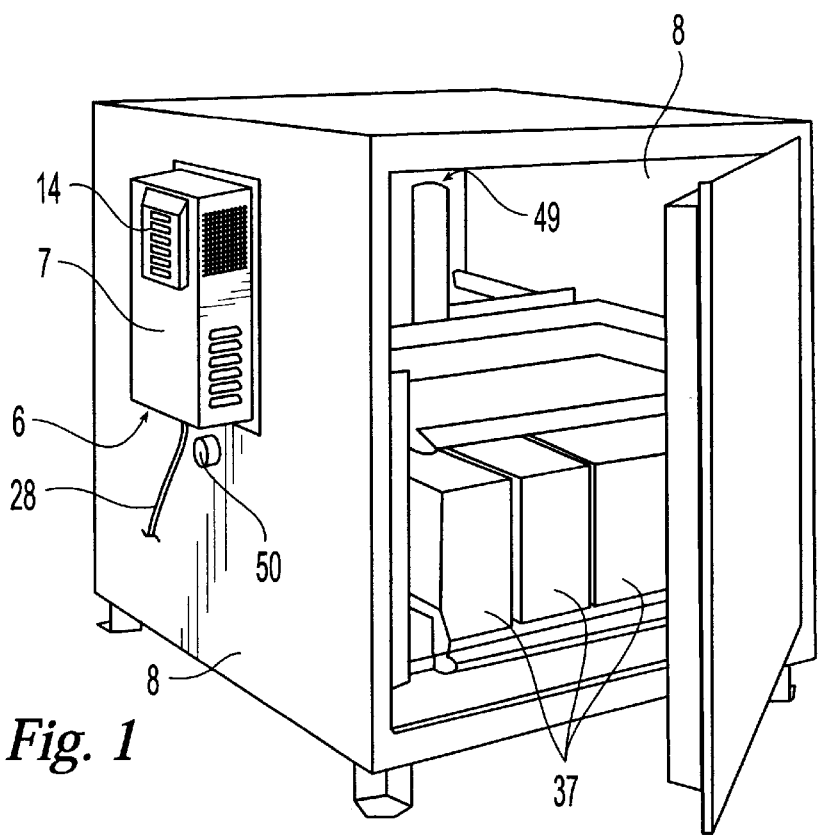
FIG. 1 is a perspective rear view of a configuration of the temperature regulating enclosure.
Figures 2, 3:
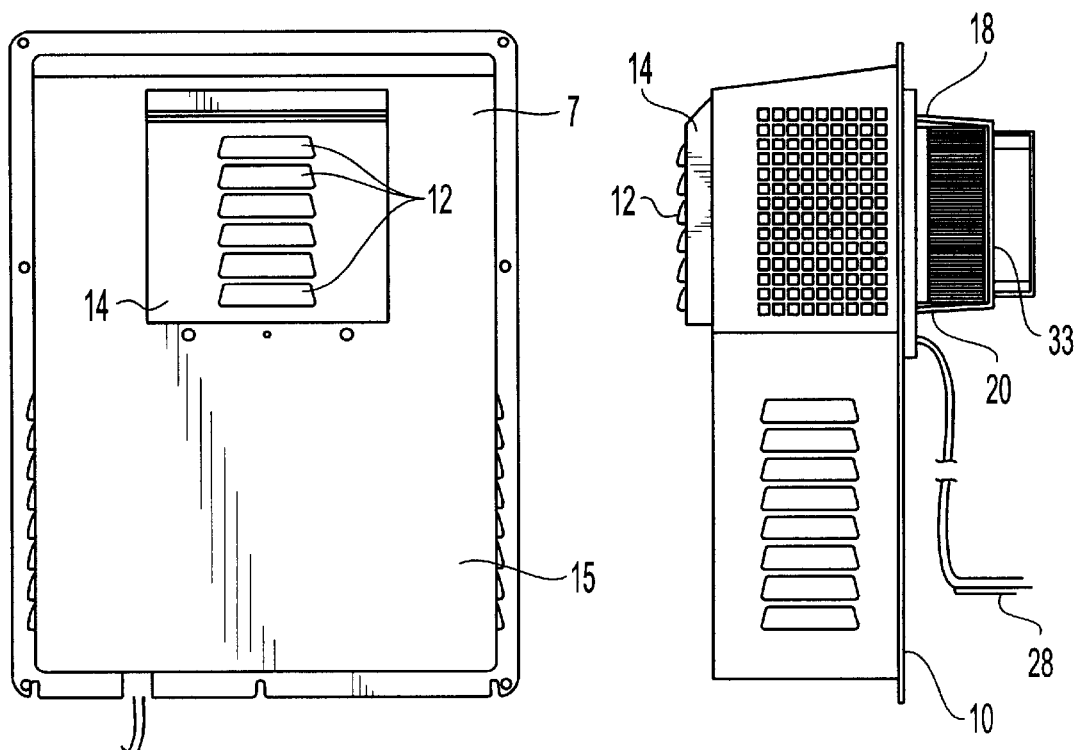
FIG. 2 is a perspective side view of a configuration the temperature regulating enclosure.
FIG. 3 is a perspective front view of a configuration of the temperature regulating enclosure.

The present invention provides a device for controlling and maintaining the ambient air temperature within a telecommunications battery enclosure. A preferred embodiment of a device 6 for controlling the ambient air temperature is shown in FIGS. 1–6. The device 6 has a housing 7 configured to be mounted to a variety of enclosures including those used to house telecommunications batteries such as the enclosure 8. A sealable battery enclosure 8 houses multiple telecommunications batteries 37 connected in series or parallel. The inventive device 6 is removably attached to battery enclosure 8 with one of at least two heat exchangers 18(a) and 18(b) invading the interior of battery enclosure 8. As shown in FIGS. 1 and 2, a mounting flange 9 on mounting plate 10 is used to secure the device 6 to the battery enclosure 8. Multiple ventilation openings 12 are formed in the housing 7. An aperture cover 14 is either mounted to or formed integrally into the exterior face 15 opposite the mounting plate 10 which is also provided with multiple ventilation openings 12. The housing 7 may be removably fixed to any enclosure having a receiving opening.

Figure 4:
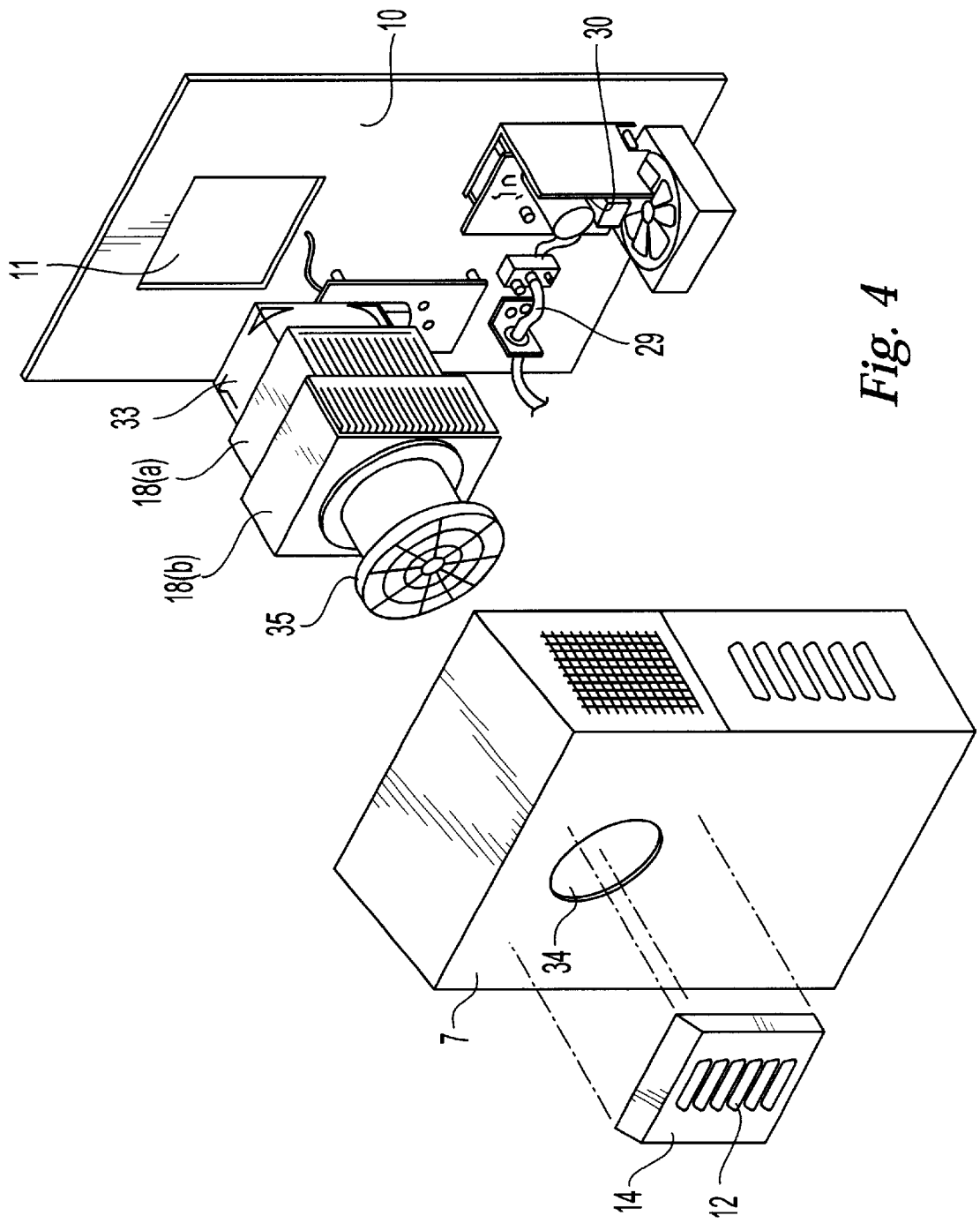
FIG. 4 is an exploded view of a configuration of the temperature regulating enclosure.
Figure 6:
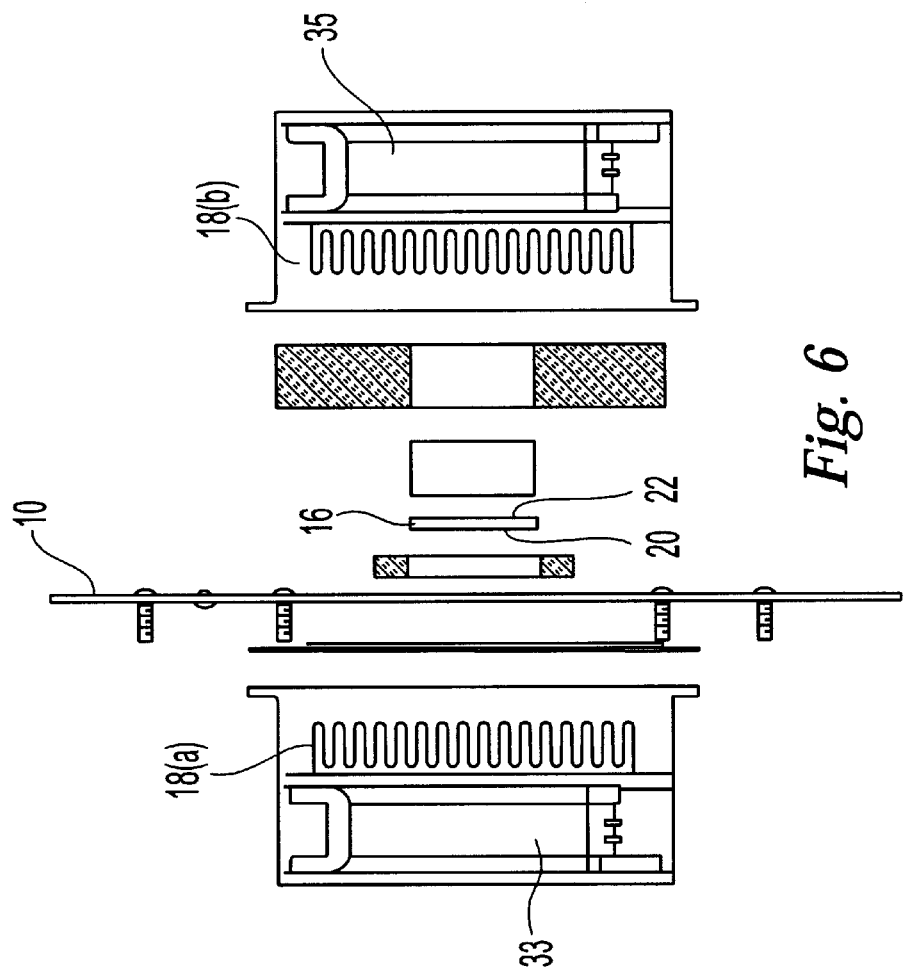
FIG. 6 is a fragmentary exploded view of a configuration of the thermoelectric device and associated heat exchangers.
Figure 5:
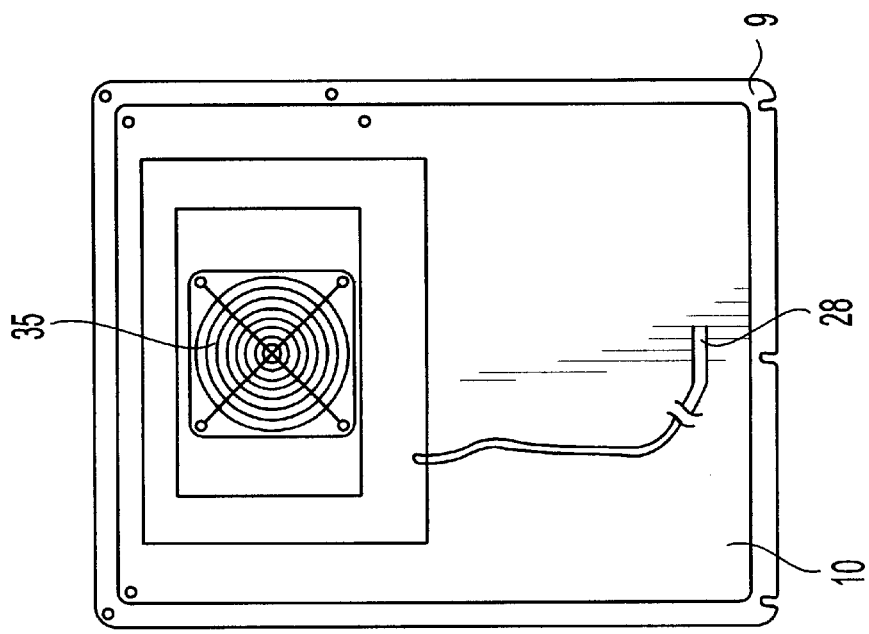
FIG. 5 is a perspective view of a configuration of the temperature regulating enclosure attached to a telecommunication battery storage container.

As shown in FIG. 2, and more thoroughly in FIGS. 4 and 6, one or more thermoelectric devices 16 are positioned between and in intimate contact with at least two heat exchangers or thermal transfer surfaces 18(a) and 18(b), and are positioned in the housing 7 to extend beyond the mounting plate 10 into the enclosure 8 when the housing 7 is fixed to the battery enclosure 8.

Although, one skilled in the art will appreciate that other thermoelectric devices may be used, the preferred embodiment utilizes a Peltier heat pump which has a hot thermal transfer surface 20 and an opposed cold thermal transfer surface 22 depending upon DC voltage polarity. A Peltier heat pump is a device which uses electric current passed across a junction between two dissimilar metals to either heat or cool the surface of the opposed metals. When the current passes across the junction in one direction, heat will be produced. When the polarity of the electric current is reversed, cold will be produced. By placing the heat pump in close contact with a heat transfer mechanism, the effective temperature, hot or cold, depending on the polarity of the supplied electric current, can be dispersed.

In one embodiment, the thermoelectric device 16 consists of p-type and n-type junctions arranged electrically in series and thermally in parallel between two metalized ceramic plates. A change in DC voltage polarity reverses hot and cold sides. Heat moves from one side to the other creating a hot side proximate to the hot thermal transfer surface 20 and a cold side proximate the opposed cold thermal transfer surface 22. Opposed cooling fans 33 and 35 are provided proximate to hot thermal transfer surface 20 and cold thermal transfer surface 22, respectively, to allow heat exchange with the surrounding environment.

A sensor 28 is configured to detect and measure ambient air temperature within the battery enclosure 8 and to selectively alter electric current by reversing polarity through the at least one thermoelectric device 16 to enable either side to be either the hot thermal transfer surface 20 or the cold thermal transfer surface 22. The reversal of polarity thereby heats or cools the ambient air via fans 33 and 35 within a predetermined temperature range. The thermoelectric device 16 is positioned between heat exchangers 18(a) and 18(b) which are predominately sealed within housing 7 having either a (depending on DC polarity) hot thermal transfer surface 20 or cold thermal transfer surface 22 with fan 33 or 35 ambiently associated with enclosure 8, through opening 11.

In geological regions which tend to exhibit higher than desired temperatures, DC polarity is reversed causing the cold thermal transfer surface 22 to cool. The cold thermal transfer surface 22 provides a cold surface which contacts heat exchanger 18(b) and the cold air is forced into enclosure 8 by fan 33. Conversely, in cool weather conditions DC polarity is reversed to provide a hot thermal transfer surface 20 which is transferred through the associated heat exchanger 18(a) and hot air is forced into enclosure 8 by fan 33. Reversal from hot to cold or cold to hot is done by reversing DC power polarity upon temperature demand sensed by sensor 28 and an associated microprocessor 29 configured to alter electric current to the thermoelectric device 16 responsive to ambient temperature in enclosure 8.

The sensor 28, the thermoelectric devices 16 and the heat exchangers 18(a) and 18(b) are powered by a common power supply 30, generally direct electrical current operating at 1.5 to 3 amperes at 120V for each thermoelectric module. The thermoelectric modules can be cascaded, arranged in series or in parallel. Electric power, such as AC converted to DC, will be supplied to the thermoelectric device but an alternate power source, such as power diverted from the provided telecommunications batteries, or other DC source, can also be used.

Referring to FIGS. 3 and 4, the housing 7 is predominantly sealed but provided with an opening 11 for receiving and mounting the heat exchanger 18(a) and the fan 33 of the thermoelectric device 16. The heat exchanger 18(b) and the fan 35 opposing the heat exchanger 18(a) and the fan 33 positioned through opening 11 is positioned adjacent an aperture 34 in the housing 7 proximate the aperture cover 14. The sensor 28 determines ambient air temperature within enclosure 8 and signals microprocessor 29 to cause responsive reversal of DC polarity within thermoelectric device 16 between either hot or cold operation according to prevailing ambient temperature conditions for the geographic region of use.

The device 6 will provide multiple ventilation openings 50 for the exchange of air between the environment and battery enclosure 8. The vents 50 will be designed to minimize condensation or evacuation of accumulated hydrogen gas from within battery enclosure 8. The vents 50 will be of sufficient size and configuration to maintain sub Lower Explosive Limits (LEL) of hydrogen gas within the battery enclosure 8.

When the battery enclosure 8 is sealed, there is no air transfer through the thermoelectric device 16. Outside air is drawn into the device 6 through aperture 11 by fan 35 and is selectively heated or cooled by thermoelectric device 16 with heat exchangers 18(a) and 18(b) and the fans 33 and 35 controlled by the sensor 28 and microprocessor 29 dependant on a preselected temperature range for the battery enclosure 8.

As batteries, particularly valve regulated lead acid batteries or sealed gel cell batteries, tend to produce hydrogen gas, it is necessary and desirable to vent accumulated hydrogen gas out of the battery enclosure 8. Generally, a 48V 125AH battery string produces 1 ml/minute of hydrogen gas. The lower explosive limit of hydrogen gas is approximately 4%. Hydrogen gas buildup may result in forceful explosions.

Therefore, when device 6 is in use, a passive hydrogen vent system, consisting of at least one conduit with an inlet 49 within the battery enclosure 8 and at least one outlet vent 50 to the space exterior of the enclosure must be provided. The inlet 49 is generally an open pipe which terminates at the outlet vent 50. As hydrogen gas accumulates within enclosure 8, the hydrogen gas passes into inlet 49 and is expelled through the outlet vent 50 into the environment. A power source can be connected to the hydrogen vent system to ensure continuous removal of hydrogen from enclosure 8.

While preferred embodiments of the invention have been shown and described, it will be apparent to those skilled in this art that various modification may be made in these embodiments without departing from the spirit or the present invention. For that reason, the scope of the invention is set forth in the following claims:

What is claimed is:

1. A thermoelectric temperature regulator for external installation on a commercial battery enclosure, comprising:
    a) a housing having at least one aperture;
    b) a thermoelectric device within the housing, the thermoelectric device comprising a thermal transfer surface and at least one heat exchanger configured to transfer thermal energy; and wherein said at least one thermal transfer surface is proximate said aperture; and
    c) a sensor configured to ascertain ambient air temperature, and a microprocessor configured to selectively reverse polarity within said thermoelectric device responsive to the ambient air temperature.

2. The device of claim 1, wherein said battery enclosure is configured to house parallel or serially connected telecommunication batteries.

3. The device of claim 1 further comprising a hydrogen gas vent configured to limit hydrogen gas accumulation within said battery enclosure below a predetermined level.

4. The device of claim 1 further comprising a powered vent means configured to limit hydrogen gas accumulation within said battery enclosure below a predetermined level.

5. A thermoelectric temperature regulator for external installation on an enclosure, comprising:
    a) a housing provided with at least one aperture, removably mounted to a battery enclosure;
    b) a thermoelectric mechanism within said housing having at least one thermal transfer surface, and at least one thermal transfer device configured to transfer thermal energy between the thermal transfer surface and a fan, wherein said at least one thermal transfer surface is proximate said aperture;
    c) a sensor configured to ascertain ambient air temperature and selectively reverse polarity within said thermoelectric device responsive to the ambient air temperature; and
    d) a vent in the battery enclosure configured to vent hydrogen gas produced by batteries selected from the group consisting of valve regulated lead acid batteries or sealed gel cell batteries.

* * * * *